United States Patent
Matsushima

(10) Patent No.: US 7,609,084 B2
(45) Date of Patent: Oct. 27, 2009

(54) OUTPUT LEVEL STABILIZATION CIRCUIT AND CML CIRCUIT USING THE SAME

(75) Inventor: Yusuke Matsushima, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 12/032,208

(22) Filed: Feb. 15, 2008

(65) Prior Publication Data

US 2008/0218199 A1  Sep. 11, 2008

(30) Foreign Application Priority Data

Mar. 7, 2007  (JP)  ............... 2007-056500

(51) Int. Cl.
*H03K 19/00* (2006.01)
*H03K 19/0944* (2006.01)
*H03K 17/687* (2006.01)

(52) U.S. Cl. .................. 326/26; 326/27; 326/115

(58) Field of Classification Search .......... 326/26, 326/27, 82, 83, 115
See application file for complete search history.

(56) References Cited

U.S. PATENT DOCUMENTS 7,425,847 B2 * 9/2008 Dimitriu ............. 326/86

FOREIGN PATENT DOCUMENTS

| JP | 2-73827 U | 6/1990 |
| JP | 7-307658 A | 11/1995 |

* cited by examiner

*Primary Examiner*—Daniel D Chang
(74) *Attorney, Agent, or Firm*—Sughrue Mion, PLLC

(57) ABSTRACT

An output level stabilization circuit being an output level stabilization circuit for a CML circuit, the output level stabilization circuit includes: a replica circuit constituted of transistors respectively having the same characteristics as one of differential-pair transistors of the CML circuit and a current source transistor; a comparison circuit which compares an output of the replica circuit with a reference voltage and supplies the comparison result as a control voltage for the current source transistor of the replica circuit; and a variable impedance circuit arranged between the output of the replica circuit and an input of the comparison circuit.

4 Claims, 4 Drawing Sheets

OUTPUT LEVEL STABILIZATION CIRCUIT AND CML CIRCUIT USING THE SAME

INCORPORATION BY REFERENCE

This application is based upon and claims the benefit of priority from Japanese patent application No. 2007-056500 filed on Mar. 7, 2007, the disclosure of which is incorporated herein in its entirety by reference.

BACKGROUND OF THE INVENTION

1. Field of the Invention

The invention relates to an output stabilization circuit and CML circuit using the same, and more particularly to an output level stabilization technique for suppressing variations in output level of a CML circuit caused by noises.

2. Related Art

In recent years, the operating frequency of LSI has been raised; and in the high-speed signal transmission in LSI, analog signals have been increasingly used. Particularly, there have been used numerous analog high-speed transmission systems using circuits based on CML (Current Mode Logic). CML circuits have been disclosed, for example, in Japanese Utility Model Laid-Open No. 2-73827 (Patent Document 1) and Japanese Patent Laid-Open No. 7-307658 (Patent Document 2). FIG. 3 illustrates an exemplary typical CML circuit 1.

Referring to FIG. 3, a pair of complementary input signals IN and INB are supplied to gates of differential-pair MOS transistors T1 and T2 having sources connected to each other; and a pair of complementary output signals OUT and OUTB are outputted from drains of these transistors T1 and T2. Resistors R1 and R2 are drain resistors of the transistors T1 and T2, respectively. A MOS transistor T3 acting as the current source is connected between the source connection point of the transistors T1 and T2 and a reference voltage point (in this example, ground); and reference voltage Vcs is supplied to a gate of this transistor T3.

The operation of the above CML circuit has been disclosed in Patent Documents 1 and 2, so this is generally known. Hence, an explanation thereof is omitted.

The above CML circuit 1 has a problem that, when noises are added to reference voltage Vcs, the output level becomes unstable, causing increased jitter and thus lowering the quality of signal transmission. Accordingly, when a CML circuit is used, tolerance to noise is required. In order to satisfy this requirement, there has been proposed a circuit illustrated in FIG. 4. FIG. 4 illustrates an exemplary circuit having a reference voltage generation circuit 2 for generating reference voltage Vcs of the CML circuit 1.

Referring to FIG. 4, the reference voltage generation circuit 2 has a replica circuit including MOS transistors T4 and T5 and a resistor R3. This replica circuit has the same circuit constant as the CML circuit 1, and has the same configuration as the one-side of the differential pair of the CML circuit 1. More specifically, the replica circuit is constituted of the transistor T4 having the same characteristics as the current source transistor T3 of the CML circuit 1, the transistor T5 having the same characteristics as the transistor T1 being one of the differential-pair transistors of the CML circuit 1, and the resistor R3 having the same resistance value as the drain resistor R1 of the transistor T1 of the CML circuit 1. The gate input of the transistor T5 is fixed at a high level.

Reference voltage Vcs is applied to the gate of the transistor T4; this reference voltage is generated by an analog comparator 21. Drain output Vrep of the transistor T5 of the replica circuit is applied via a feedback resistor R4 to a positive-phase input of this comparator 21. Voltage division output Vref obtained through voltage division between voltage divider resistors R5 and R6 is applied to a negative-phase input of the comparator 21.

This voltage division output Vref is set identical to the low level output voltage of the CML circuit 1; thus, the resistors R5 and R6 are set to have a resistance value ratio therebetween so that the voltage division output Vref is identical to the low level output voltage of the CML circuit 1. Drain voltage Vrep of the transistor T5 being the output of the replica circuit is identical to the output voltage of the CML circuit 1 when the input (IN or INB) of the CML circuit 1 has a high level.

The operation of the circuit of FIG. 4 will be described below. First, the operation in a low frequency range will be described. When output Vrep of the replica circuit is higher than voltage division output Vref obtained through the resistors R5 and R6, output Vcs of the analog comparator 21 rises and thus output Vrep of the replica circuit lowers. Conversely, when output Vrep of the replica circuit is lower than voltage division output Vref, output Vcs of the analog comparator 21 lowers and thus output Vrep of the replica circuit rises. This operation causes output Vrep of the replica circuit to converge at the time of reaching voltage division output Vref, so that output Vrep of the replica circuit becomes identical to the low level output voltage (Vref) of the CML circuit.

Here, when an open-loop gain between the comparator 21 and replica circuit is Go, a closed-loop gain Gc of a feedback circuit from the replica circuit to the comparator 21 is expressed as Gc=Go/(1+Go). Thus, the gain of the comparator 21 is raised to maximize Go, so that Gc is made closest to "1", whereby the difference between output Vrep of the CML circuit 1 and voltage division output Vref obtained through the resistors R5 and R6 can be reduced, allowing stabilizing output Vrep.

The operation in which high-frequency noise is taken into consideration will be described. When an external high-frequency noise inputs, and when the above described closed-loop high-frequency gain of the feedback circuit exceeds "1", the high-frequency noise is amplified. As described above, the gain of the comparator 21 has been raised in view of the low-frequency operation, so the gain of the comparator 21 cannot be lowered. Thus, a resistor R4 is inserted in the feedback circuit section, so that only the gain of the whole closed loop is lowered.

In this way, when the resistor R4 is inserted in the feedback circuit, the closed-loop gain can be lowered to suppress the noise amplification. However, the phase of high-frequency noise varies depending on the resistance value, and resonance may occur according to the amplitude of this variation. This indicates that there exists a particular frequency which corresponds to a given resistance value and constitutes a weak point regarding noise amplification. Effects caused by such a frequency must be eliminated.

SUMMARY

An exemplary object of the invention is to provide an output level stabilization circuit for a CML circuit which can modify a resonant frequency of noise to suppress its effects caused by the frequency, allowing stabilizing the output level, and also provide a CML circuit using the output level stabilization circuit.

The output level stabilization circuit according to an exemplary aspect of the invention includes: a replica circuit constituted of transistors respectively having the same characteristics as one of differential-pair transistors of the CML circuit and a current source transistor; a comparison circuit which compares an output of the replica circuit with a reference voltage and supplies the comparison result as a control voltage for the current source transistor of the replica circuit; and a variable impedance circuit arranged between the output of the replica circuit and an input of the comparison circuit.

The CML circuit according to an exemplary aspect of the invention includes the above output level stabilization circuit, and the comparison result is supplied to a control input of the current source transistor of the CML circuit.

EXEMPLARY EMBODIMENTS

Figure 1:
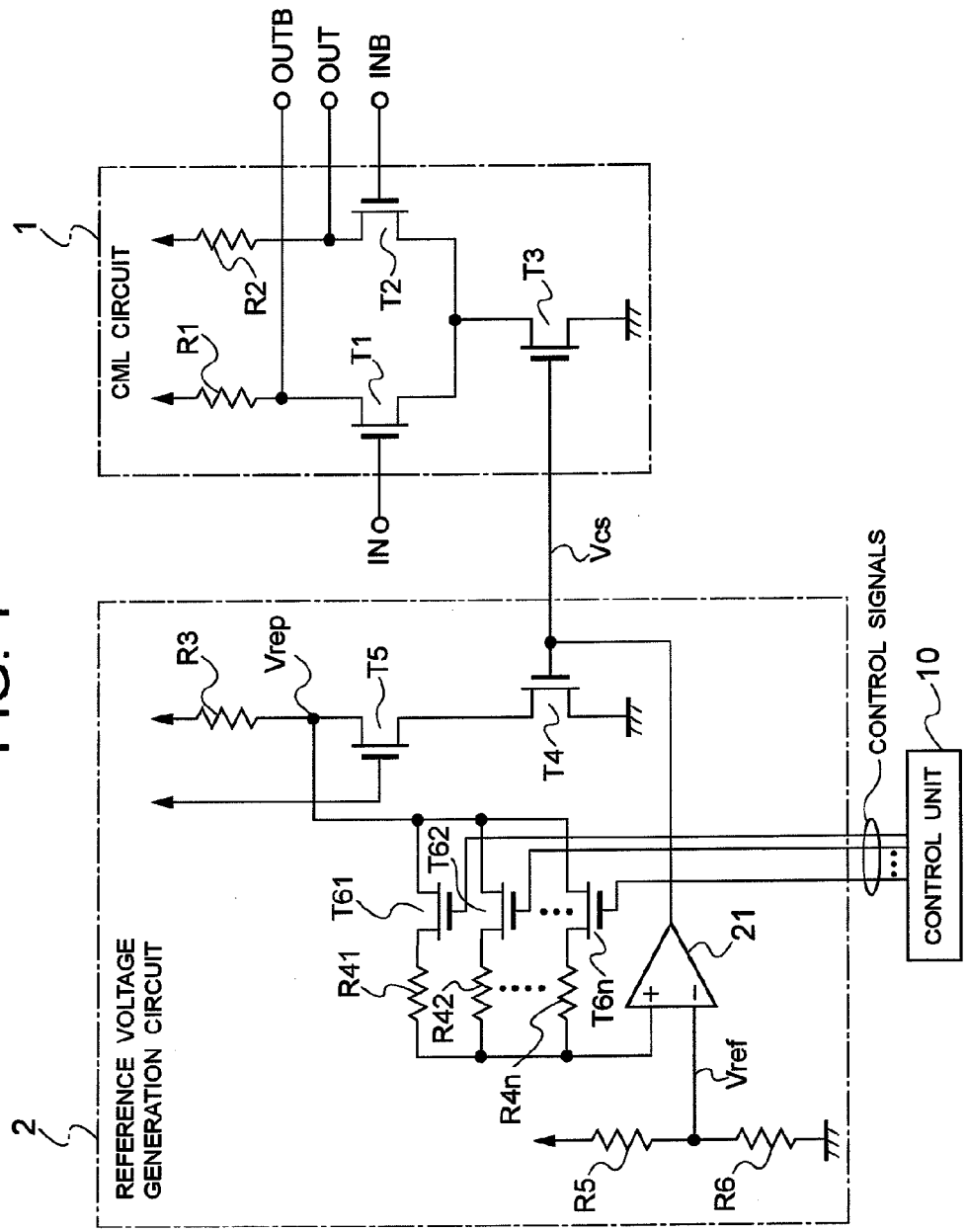
FIG. 1 is a circuit diagram according to an exemplary embodiment of the invention.

Exemplary embodiments of the invention will be described below with reference to the drawings. FIG. 1 is a circuit diagram according to an embodiment of the invention, in which the same reference characters are applied to parts corresponding to those of FIG. 4. Only parts different from FIG. 4 will be described with reference to FIG. 1. Referring to FIG. 1, multiple resistors R41 to R4n (n being an integer of two or more) are arranged in parallel, instead of the feedback resistor R4 in the feedback loop of FIG. 4.

In order to control insertion of these resistors R41 to R4n in the feedback loop, MOS transistors T61 to T6n are connected in series to the resistors R41 to R4n, respectively. Control signals are supplied to respective gates of the transistors T61 to T6n from a control unit 10, and using these control signals, the transistors T61 to T6n can be on-off controlled.

Figure 4:
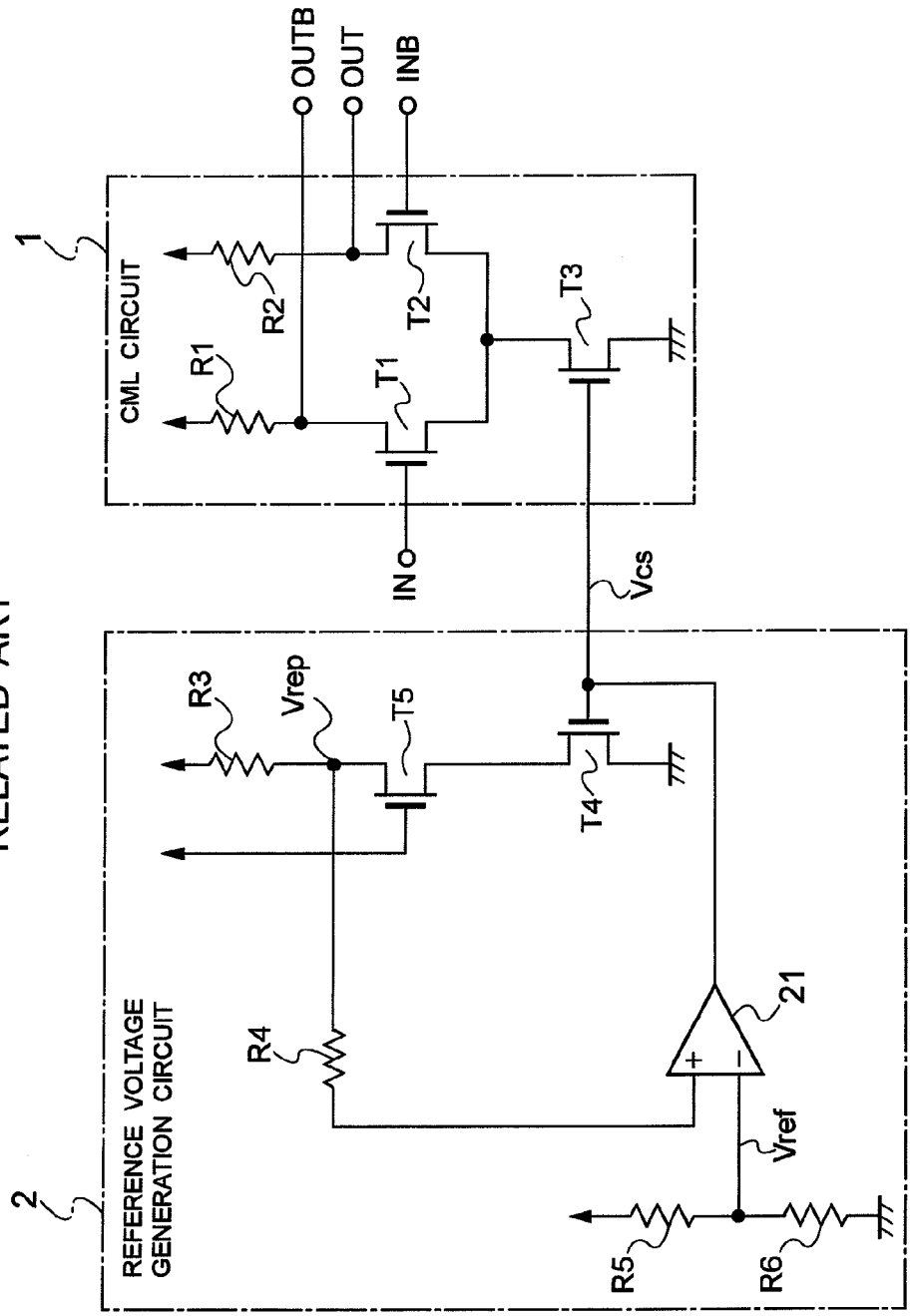
FIG. 4 is a view illustrating an exemplary reference voltage generation circuit which generates a reference voltage for the CML circuit.

The other circuit constituent elements are identical to those of FIG. 4, and hence an explanation thereof is omitted.

As described above, when a resistor is inserted in the feedback section, the closed-loop gain can be lowered to suppress noise amplification. However, the phase of high-frequency noise varies depending on the resistance value of that resistor, and resonance may occur according to the amplitude of this variation. More specifically, there exists a particular frequency which corresponds to a given resistance value and constitutes a weak point regarding noise amplification.

Thus, according to the present embodiment, in the feedback resistor (R4 in FIG. 4) section, there is used a circuit in which the impedance can be changed by the control signals, so that the resonant frequency can be avoided to provide a stable operation. More specifically, the control signals appropriately perform on/off control of the transistors T61 to T6n so that the resistance value (impedance value) of the feedback resistor to be actually inserted in the feedback loop is changeable.

With the above configuration, when a resonance with respect to high-frequency noise occurs at a given resistance value, the on/off states of the transistors T61 to T6n are changed using the control signals to change the resistance value, thereby allowing prevention of occurrence of the resonance. For example, assume that, while the transistors T61 and T62 are turned on and thus the resistors R41 and R42 are inserted in the feedback loop, the output level of the CML circuit 1 becomes unstable due to the occurrence of a noise. In this state, when the transistor T63 is turned on and the resistor R43 is additionally inserted in the feedback loop, the resistance value of the feedback loop changes, so that the resonant state with respect to this noise can be prevented.

In the present example, the resistance value of the feedback resistor is changed using multiple resistors and multiple transistors. However, it will easily be appreciated that the resistance value can be changed using a variable resistor.

Figure 2:
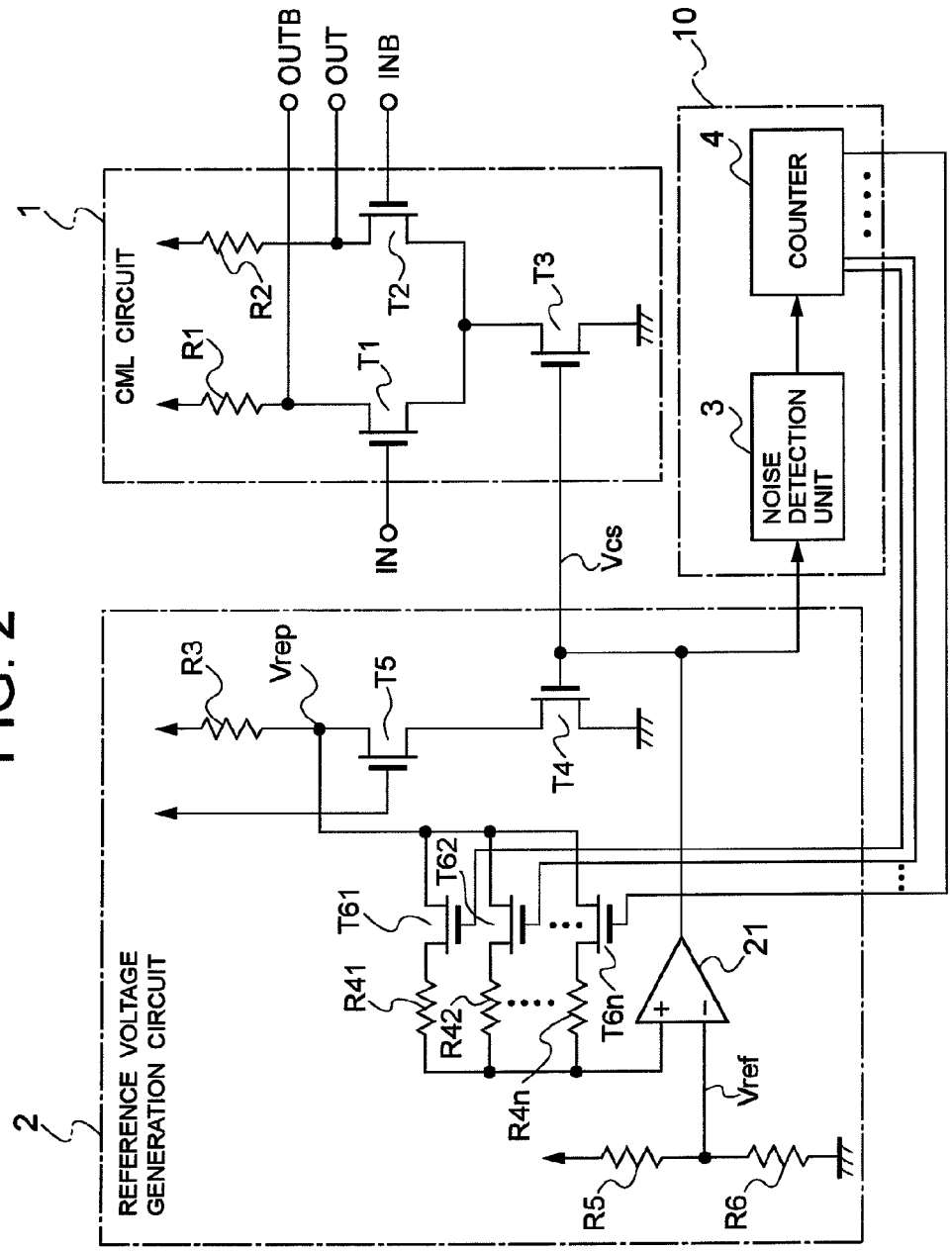
FIG. 2 is a circuit diagram according to another exemplary embodiment of the invention.
Figure 3:
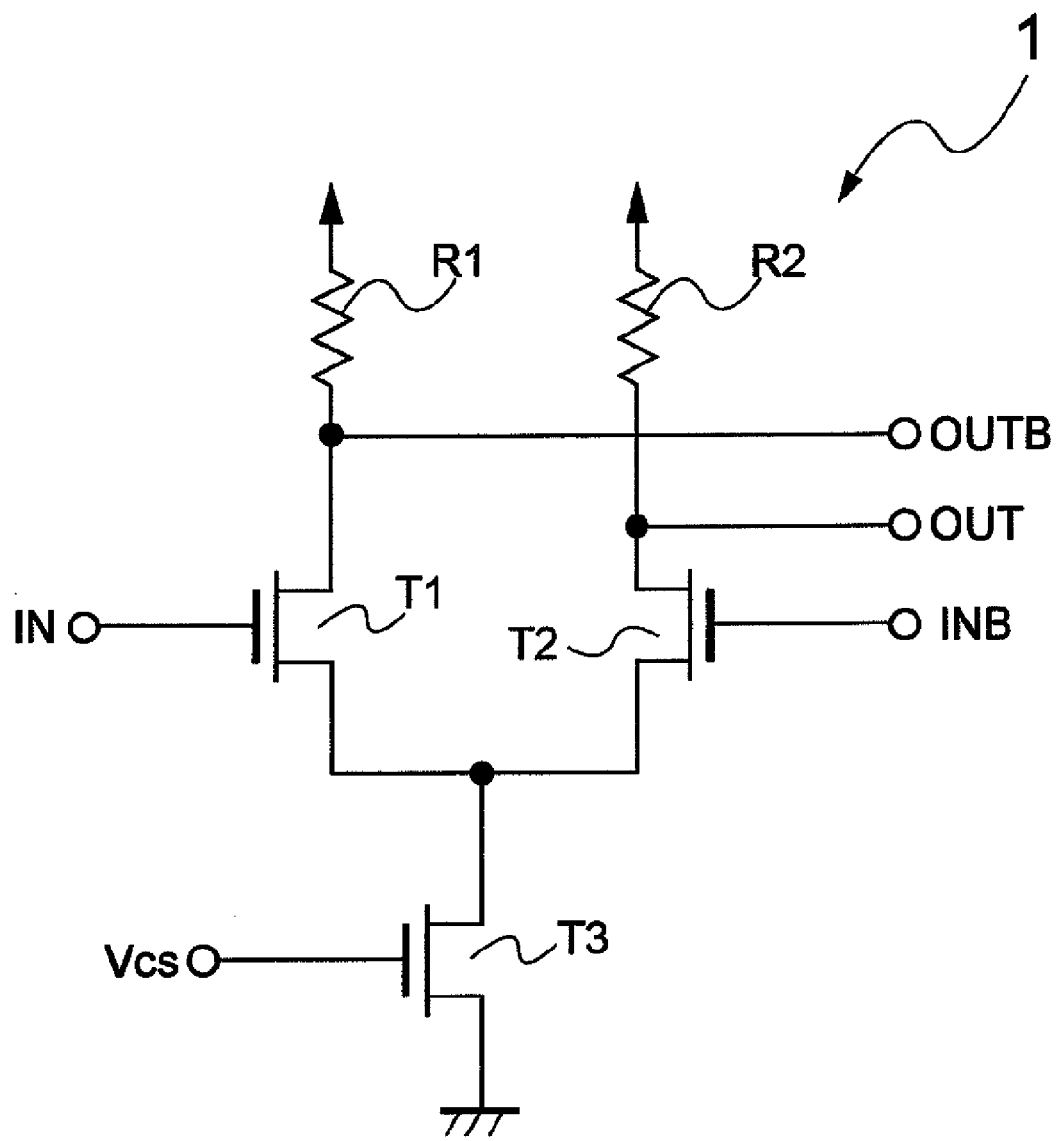
FIG. 3 is a view illustrating an exemplary CML circuit.

FIG. 2 is a circuit diagram according to another exemplary embodiment of the invention, in which the same reference characters are applied to parts corresponding to those of FIG. 1. In this example, the control signals illustrated in FIG. 1 are automatically generated. For this purpose, in the output of the analog comparator 21, there are provided a noise detection unit 3 for detecting a noise and a counter 4 in which the counter value is changed by the detection output from the noise detection unit 3; outputs of the counter 4 are used as the control signals for the transistors T61 to T6n. The other constituent elements are identical to those of FIG. 1.

When a noise is detected by the noise detection unit 3, it is determined that a resonance has occurred. Accordingly, a n-th digit counter value of the counter 4 is incremented or decremented (increased or decreased), and based on the n-th digit counter value, the transistors T61 to T6n are subjected again to on/off control. As a result, the resistance value of the feedback resistor is changed to prevent the resonant state. Thus, adverse effects caused by resonant noises can be automatically prevented.

By way of example, assume that the transistors T61 and T62 are turned on by the n-bit output of the counter 4 and thus the resistors R41 and R42 are inserted in the feedback loop. In this state, when a noise occurs, this is detected by the noise detection unit 3, and the resultant detection pulse increments the counter 4. Then, the n-bit output changes, so that, in addition to the transistors T61 and T62, the transistor T63 is also turned on. Accordingly, in addition to the resistors R41 and R42, the resistor R43 is inserted in the feedback loop, whereby the resonant state is prevented.

In the above described embodiments, MOS transistors are used as transistors. However, in general, FET devices or bipolar devices can be used. Also, it is apparent that, as the transistors T61 to T6n which control insertion of the feedback resistors R41 to R4n in the feedback loop, any switching device can be used as long as it performs a switching operation according to an external control signal.

An exemplary advantage according to the invention is that, since noise resonant frequency can be modified, effects caused by noise can be suppressed and thus the output level can be stabilized.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

What is claimed is:

1. An output level stabilization circuit for a CML circuit, the output level stabilization circuit comprising:
    a replica circuit comprising of transistors respectively having the same characteristics as one of differential-pair transistors of the CML circuit and a current source transistor;
    a comparison circuit which compares an output of the replica circuit with a reference voltage and supplies the comparison result as a control voltage for the current source transistor of the replica circuit;

a variable impedance circuit arranged between the output of the replica circuit and an input of the comparison circuit;

a noise detection unit which detects a noise in the comparison result; and a control unit which variably controls the impedance of the variable impedance circuit in response to the noise detection.

2. The output level stabilization circuit according to claim 1, wherein the variable impedance circuit comprises a plurality of resistor devices connected in parallel, and a plurality of switching devices connected in series to the respective resistor devices; wherein the control unit performs on/off control of the switching device.

3. The output level stabilization circuit according to claim 2, wherein the control unit is a counter which counts up or down in response to the noise detection unit, and an output of the counter performs on/off control of the switching device.

4. A CML circuit comprising an output level stabilization circuit according to claim 1, wherein the comparison result is supplied to a control input of the current source transistor of the CML circuit.

* * * * *